United States Patent
Kim et al.

(10) Patent No.: US 9,887,228 B2
(45) Date of Patent: Feb. 6, 2018

(54) IMAGE SENSOR WITH OBLIQUE PICK UP PLUG AND SEMICONDUCTOR STRUCTURE COMPRISING THE SAME

(71) Applicant: Himax Imaging, Inc., Grand Cayman (KY)

(72) Inventors: Kihong Kim, Grand Cayman (KY); Yu Hin Desmond Cheung, Grand Cayman (KY)

(73) Assignee: Himax Imaging, Inc., Grand Cayman (KY)

( * ) Notice: Subject to any disclaimer, the term of this patent is extended or adjusted under 35 U.S.C. 154(b) by 0 days.

(21) Appl. No.: 14/159,341

(22) Filed: Jan. 20, 2014

(65) Prior Publication Data
US 2015/0206918 A1    Jul. 23, 2015

(51) Int. Cl.
*H01L 27/146* (2006.01)

(52) U.S. Cl.
CPC .. *H01L 27/14636* (2013.01); *H01L 27/14656* (2013.01); *H01L 27/1463* (2013.01); *H01L 27/14643* (2013.01)

(58) Field of Classification Search
CPC . H01L 27/146; H01L 27/144; H01L 27/1463; H01L 27/14636; H01L 27/14643; H01L 27/14656
See application file for complete search history.

(56) References Cited

U.S. PATENT DOCUMENTS

| 2006/0118837 | A1* | 6/2006 | Choi | H01L 27/14603 257/292 |
| 2007/0023854 | A1* | 2/2007 | Park | H01L 27/14689 257/462 |
| 2012/0007665 | A1  | 1/2012 | Lee | |
| 2012/0175707 | A1* | 7/2012 | Jung | H01L 21/28518 257/368 |
| 2012/0301989 | A1* | 11/2012 | Hashimoto | H01L 31/18 438/57 |
| 2013/0264467 | A1* | 10/2013 | Hong | H01L 27/14609 250/208.1 |
| 2014/0042507 | A1* | 2/2014 | Iwata | H01L 27/14612 257/294 |
| 2014/0077271 | A1* | 3/2014 | Fujii | H01L 27/1461 257/239 |
| 2014/0111664 | A1* | 4/2014 | Kumano | H01L 27/14629 348/222.1 |

FOREIGN PATENT DOCUMENTS

| TW | 200931655 | | 7/2009 |
| TW | 201332092 | A1 | 8/2013 |

* cited by examiner

*Primary Examiner* — Tom Thomas
*Assistant Examiner* — Benjamin Tzu-Hung Liu
(74) *Attorney, Agent, or Firm* — Winston Hsu

(57) ABSTRACT

An image sensor includes a substrate, multiple pixel regions separately disposed in the substrate, and a pick up region including a doping region and a pick up plug obliquely disposed on the doping region and directly contacting the doping region.

15 Claims, 7 Drawing Sheets

IMAGE SENSOR WITH OBLIQUE PICK UP PLUG AND SEMICONDUCTOR STRUCTURE COMPRISING THE SAME

BACKGROUND OF THE INVENTION

1. Field of the Invention

The present invention generally relates to a semiconductor structure. In particular, the present invention is directed to a semiconductor structure for use in an image sensor with an oblique pick up plug enabling an alternative conductive path to dissipate electrons.

2. Description of the Prior Art

A semiconductor device is widely used in electronic apparatuses. For example, a camera including an image sensor is widely used in portable apparatuses, such as mobile phones.

Since lighter, thinner and smaller mobile phones are more popular, a desirable image sensor is the smaller the better. In addition, a smaller image sensor is at the same time required to have higher resolution to meet the market demands.

FIG. 1 is a cross-section view of an image sensor 9. The image sensor includes a P+ substrate 10, pixel regions 39 and P-type isolations 19. As shown in FIG. 1, when image sensor 9 is exposed to light, the pixel regions 39 serve as photo diodes to receive light and generate image signals by producing electrons 11. The generated electron holes 12 should be quickly dissipated to the ground via the p-type isolation 19 and the substrate 10. The p-type isolation 19 separates the pixels regions 39 apart.

One possible solution to shrink the image sensor and simultaneously to enhance the resolution is to scale down each cell unit in the image sensor. More specifically speaking, both the pixel regions and the p-type isolations need scaling down.

However, smaller p-type isolations 19 between the pixel regions 39 results in higher electric resistance of the p-type isolations 19 and worse device performance due to a reduced cross section. This is a trade-off between two extremes, namely better device performance and a smaller device size.

SUMMARY OF THE INVENTION

In the light of the above, the present invention proposes a novel image sensor to scale down both the pixel region size as well as the dissipating isolations size in order to pursue better device performance and a smaller device size at the same time. The novel image sensor proposed by the present invention shows an excellent solution to the above-mentioned dilemma.

The novel image sensor of the present invention includes a substrate, at least two pixel regions, an isolation region and at least one pick up region. The substrate has a first dopant. At least two pixel regions are separately disposed in the substrate. The isolation region is used for isolating each of the pixel regions. At least one pick up region is formed in the isolation region and includes a doping region and a pick up plug which is orthogonally disposed on the doping region and in direct contact with the doping region.

In one embodiment of the present invention, the pick up plug is grounded to enable an upward conductive path to dissipate electrons coming from the pixel regions other than via the substrate.

In another embodiment of the present invention, the doping region is not in direct contact with any one of the pixel regions.

In another embodiment of the present invention, the pick up plug is orthogonally arranged on the doping region to gain a misalignment margin.

In another embodiment of the present invention, the image sensor further includes a neighboring pixel region of the second dopant. The neighboring pixel region is disposed in the substrate and arranged adjacently to the previous at least two pixel regions to be a third pixel region or a fourth pixel region.

In another embodiment of the present invention, the doping region is not in direct contact with the neighboring pixel region.

In another embodiment of the present invention, the pick up plug is slantingly arranged on a surface with respect to the neighboring pixel region.

In another embodiment of the present invention, the pick up plug is electrically connected to a metal routing which is disposed on the pick up plug.

In another embodiment of the present invention, the pick up plug includes a metal material, for example W.

In view of the above, the present invention also proposes another novel semiconductor structure to scale down both the dissipating isolation size as well as the pixel region size in order to pursue better device performance and a smaller device size at the same time. The novel semiconductor structure proposed by the present invention shows an excellent solution to the above-mentioned dilemma.

The novel semiconductor structure of the present invention includes a substrate, at least two pixel regions, an isolation region and at least one pick up region. The substrate has a first dopant. At least two pixel regions are separately disposed in the substrate to form a pixel unit. The isolation region is used for isolating each of the pixel regions. The pickup region is formed in the isolation region and includes a doping region obliquely disposed with respect to the pixel regions and a pick up plug disposed on the doping region and in direct contact with the doping region.

In one embodiment of the present invention, the pick up plug is grounded to enable a conductive path to dissipate electrons coming from the pixel regions other than via the substrate.

In another embodiment of the present invention, the doping region is not in direct contact with the pixel regions.

In another embodiment of the present invention, the pick up plug is orthogonally arranged on the doping region to gain a misalignment margin.

In another embodiment of the present invention, the semiconductor structure is for use in an image sensor cell.

In another embodiment of the present invention, the pick up plug is rectangular.

In another embodiment of the present invention, the pick up plug is obliquely arranged with respect to the pixel regions.

In another embodiment of the present invention, the pick up plug is electrically connected to a metal routing which is disposed on the pick up plug.

In another embodiment of the present invention, the pick up plug includes a metal material, for example W.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
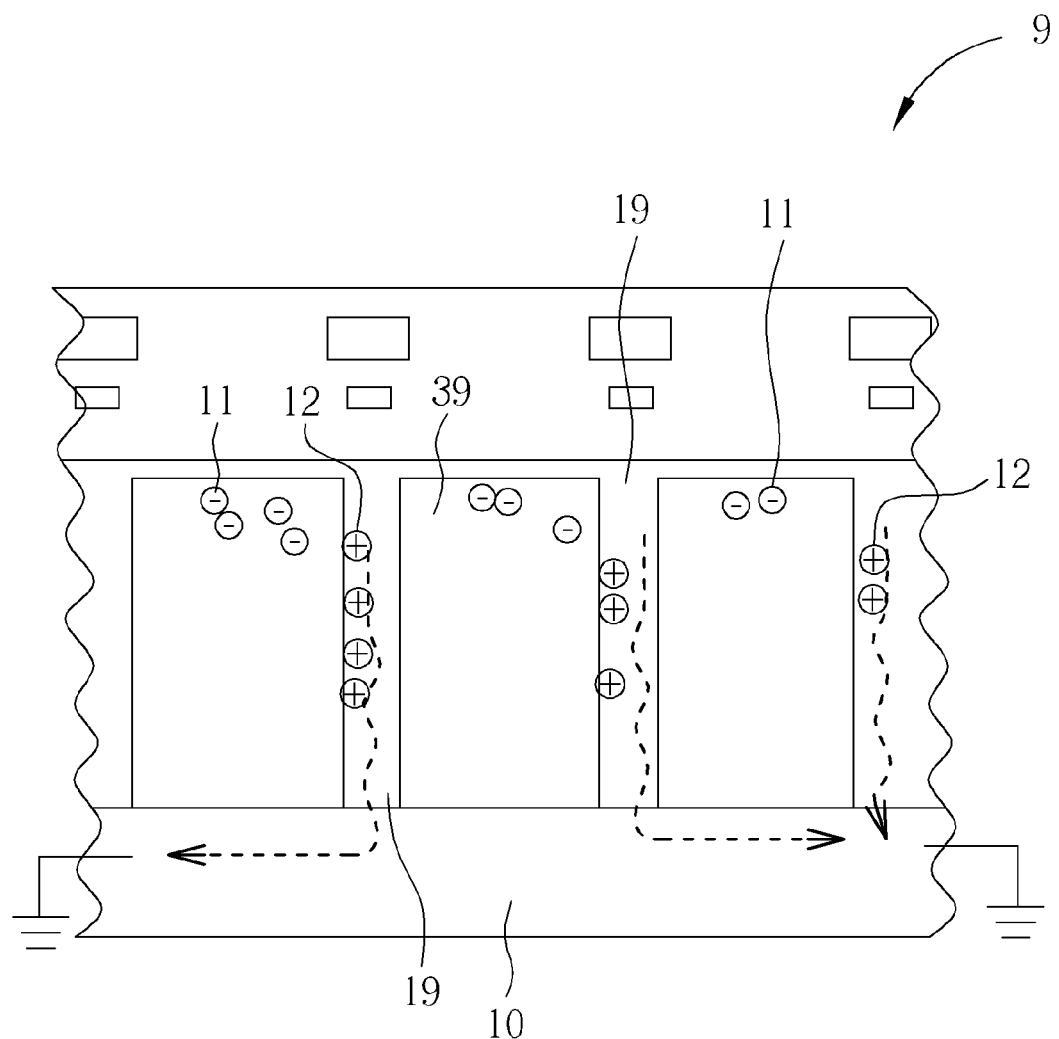
FIG. 1 illustrates a cross-section view of an image sensor in prior art.
Figure 2:
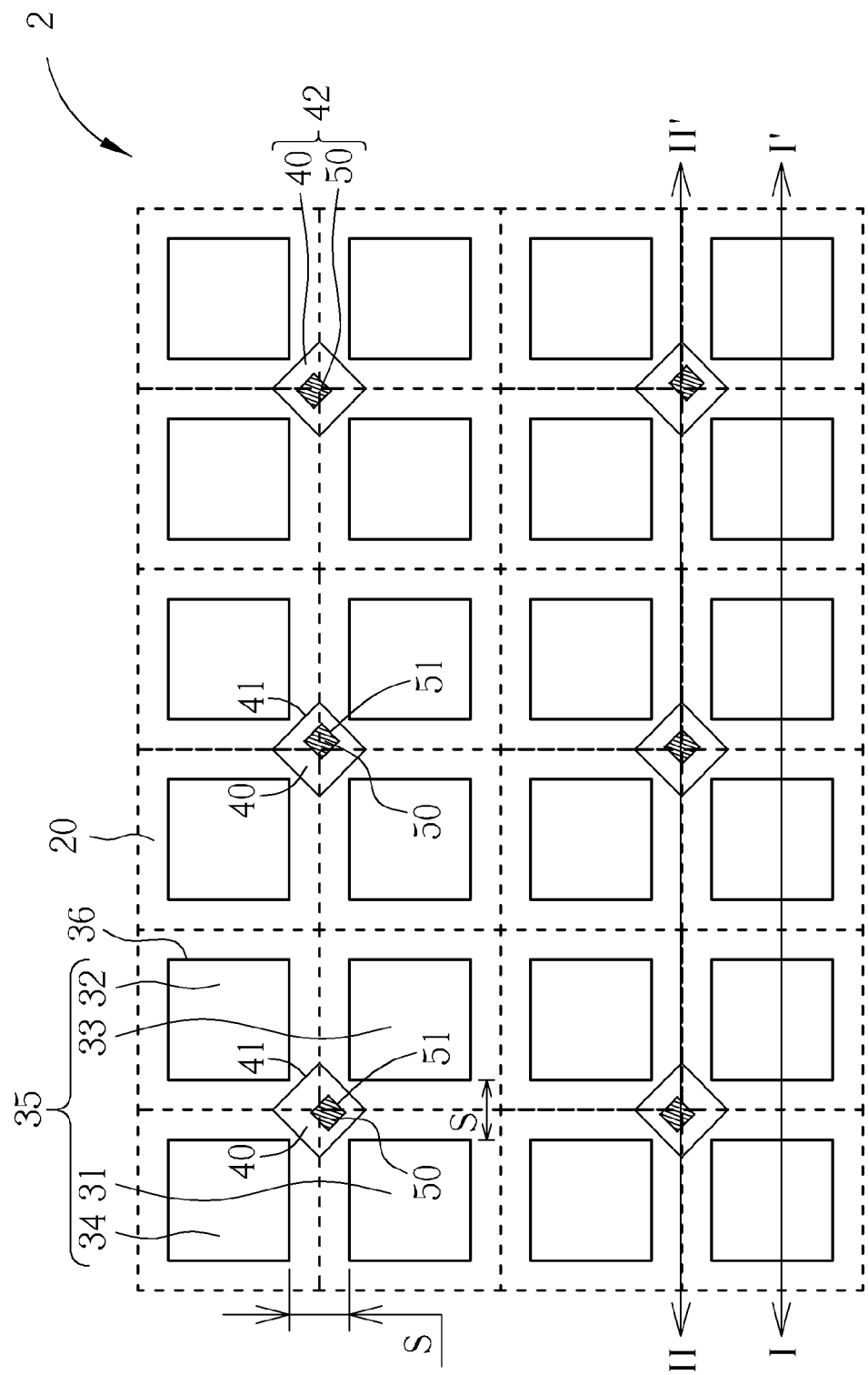
FIG. 2 illustrates a top view of the image sensor of the present invention.
Figure 3:
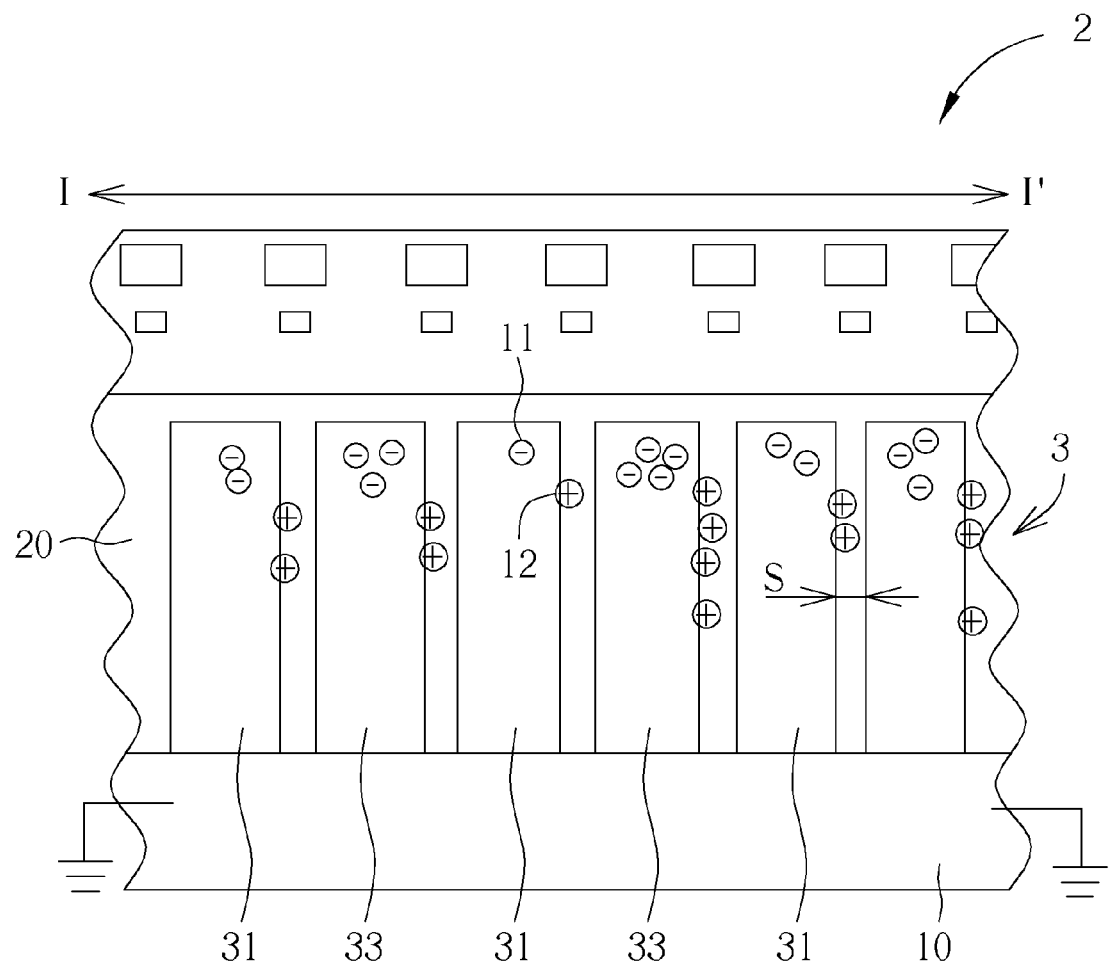
FIG. 3 illustrates an example of the semiconductor structure in the image sensor of the present invention.
Figure 4:
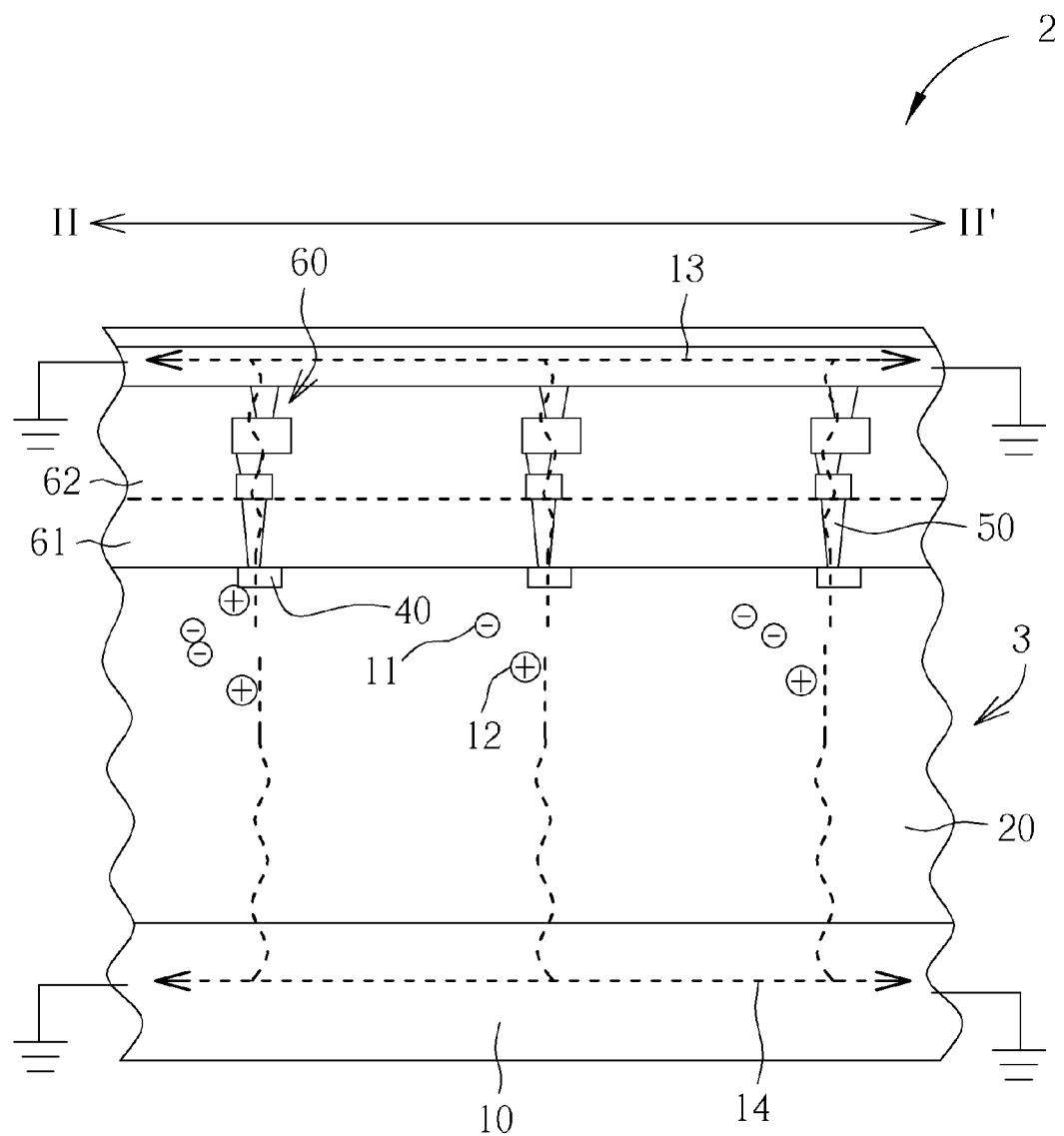
FIG. 4 illustrates an example of multiple pick up plugs in the image sensor of the present invention.

Image sensors can be classified by main carrier as a hole type and an electron type. The embodiments illustrate the image sensor by the electron type, but not limit to. The embodiments of the present invention provides an image sensor with a grounded pick up plug which enables a new upward conductive path other than via the substrate to facilitate the dissipation of holes generated during exposure of the pixel regions. FIG. 2, FIG. 3 and FIG. 4 illustrate an image sensor of an embodiment of the present invention. FIG. 3 and FIG. 4 respectively illustrate a cross section of Line I-I' and Line II-II' in FIG. 2.

As shown in FIG. 2, FIG. 3 and FIG. 4, the novel image sensor 2 of the embodiment of the present invention includes a substrate 10, an isolation region 20, pixel regions such as 31, 32, 33 and 34, and pick up regions 40. The substrate 10 may be a semiconductive material, such as Si and has been doped to have a first dopant, such as a P-type dopant. Each of the pickup regions 40 is a diffusion region with a pick up plug 50 to electrically connect the pickup region 40 to a ground.

The isolation region 20 is disposed on the substrate 10 to isolate each pixel region. The isolation region 20 may be Si and has the same dopant like the substrate 10 does, such as a P-type dopant. However, the dopant concentration in the isolation region 20 and in the substrate 10 may be different. In addition, the isolation region 20 may not necessarily have a uniform dopant concentration. For example, the substrate 20 may have a variant dopant concentration gradient.

There are plural pixel regions disposed in the substrate 10, for example a first pixel region 31, a second pixel region 32, an optional third pixel region 33 and an optional fourth pixel region 34. The pixel regions are separately disposed and isolated by the isolation region 20. In particular, as shown in FIG. 2, some of the pixel regions are arranged in a diagonal way with respect to each other. For example, the first pixel region 31 and the second pixel region 32 are segregated by a diagonal distance and a diagonal arrangement.

Further, in another aspect of the present invention, there may be more than two pixel regions disposed in the substrate 10. For example, there may be at least one neighboring pixel region or more than one neighboring pixel regions, such as a third pixel region 33 or an additional and optional fourth pixel region 34, disposed in the substrate 10. The third pixel region 33 and the fourth pixel region 34 are arranged adjacent to the first pixel region 31 and the second pixel region 32. As shown in FIG. 2, the first pixel region 31, the second pixel region 32, the third pixel region 33 and the fourth pixel region 34 are all segregated by a space S with respect to the adjacent pixel regions. Basically, the third pixel region 33 or the fourth pixel region 34 are similar to the first pixel region 31 and the second pixel region 32.

As shown in FIG. 3 and FIG. 4, the above pixel regions may serve as the photodiodes of an image sensor cell 35 in the semiconductor structure 3 to generate image signals by producing electrons 11 and electron holes 12 in pair when they are exposed to light. The suddenly and abundantly generated electron holes 12 should be quickly dissipated to the ground supposing the pixel regions in the semiconductor structure 3 should function properly and promptly.

As shown in FIG. 2 and FIG. 3, when the image sensor 2 becomes smaller, so do the pixel regions in a pixel unit 35 as well as the space S but the doping regions 40 in the image sensor 2 are less and less easily to align with the pixel regions. A tighter design rule and stricter overlay requirement are therefore needed. However, misalignment of the source/drain regions to the pixel regions frequently occurs because the current technology may not support such tight design rules or such strict overlay requirements. The present invention accordingly demonstrates different approaches to solve the problems.

As shown in FIG. 2, the embodiment of the present invention in the light of the above demonstrates a doping region 40 or a pick up plug 50 in a pickup region to be disposed in the isolation region 20 and obliquely disposed between the pixel regions. The definite term "oblique" or "obliquely" in the present invention means that one side of a geometrical shape is neither parallel with nor perpendicular to a side of another geometrical shape.

Figure 5:
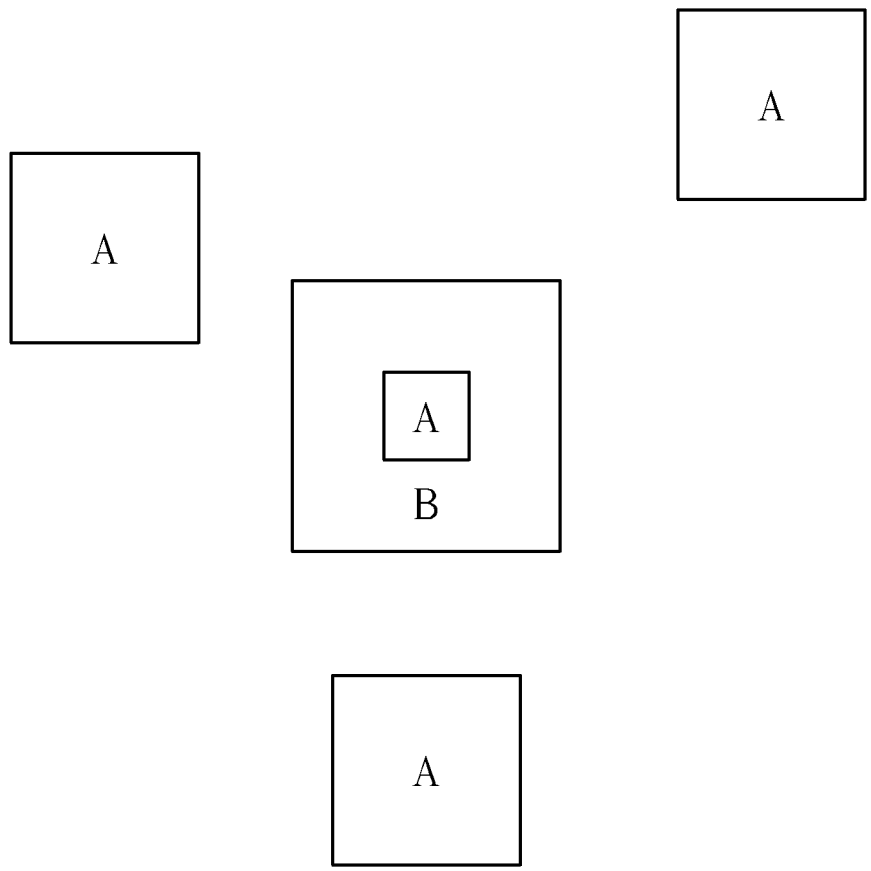
FIG. 5 illustrates the examples of being "orthogonal" of the present invention.
Figure 6:
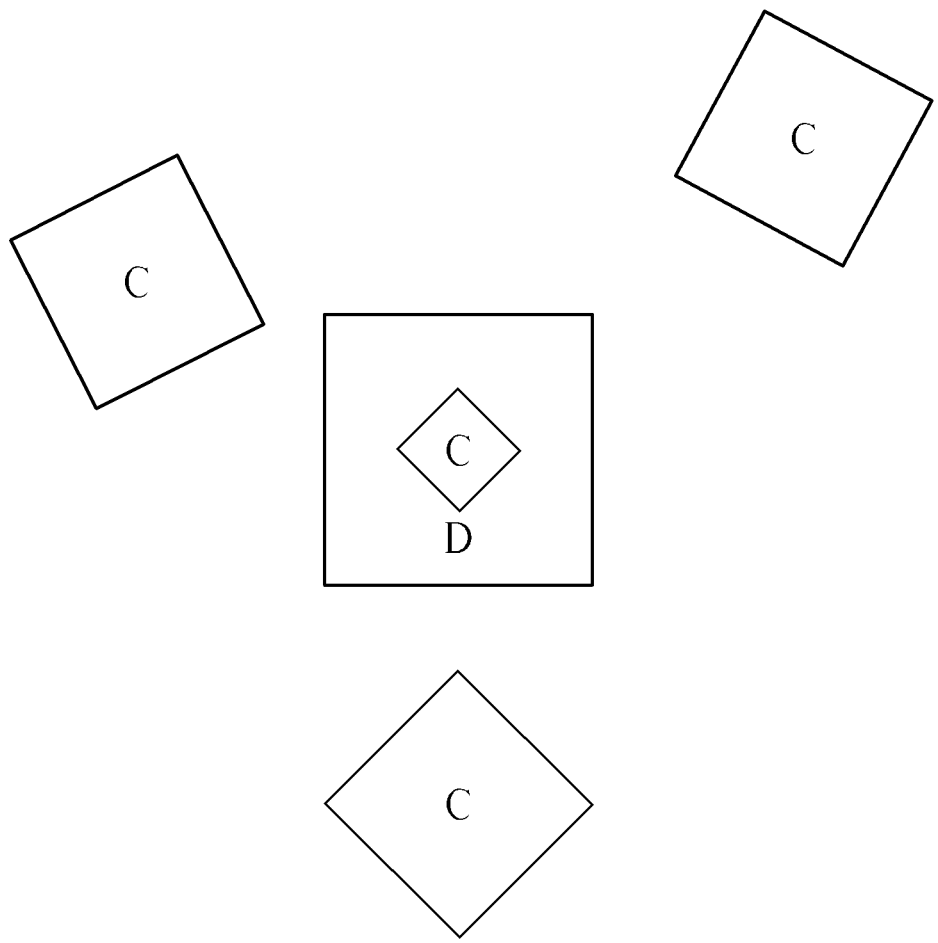
FIG. 6 illustrates the examples of "oblique" of the present invention.

For example, as shown in FIG. 5, all of the rectangular A are orthogonal with respect to the rectangular B because any side of the rectangular A is either parallel with or perpendicular to a side of the rectangular B. Alternatively, as shown in FIG. 6, all of the rectangular C are oblique, or alternatively speaking slantingly arranged, with respect to the rectangular D because any side of the rectangular C is neither parallel with nor perpendicular to a side of the rectangular D.

As shown in FIG. 2, because the doping region 40 is obliquely disposed between the two pixel regions 31/32 or further between the optional pixel regions 33/34, the doping region 40 is not in direct contact with the two pixel regions 31/32, or not in direct contact with the optional pixel regions 33/34. When all the four pixel regions 31/32/33/34 are present, the four pixel regions 31/32/33/34 and the doping region 40 together form a semiconductor structure 3 with a pickup region 42, as shown in FIG. 2.

Further, as shown in FIG. 2, since any edges 41 of the doping region 40 are disposed in the substrate 10 and just between two adjacent pixel regions, the doping region 40 surely keeps a proper distance to the two pixel regions 31/32, or further to the optional pixel regions 33/34 and to gain a larger process window for the alignment steps, namely to gain a misalignment margin.

Figure 7:
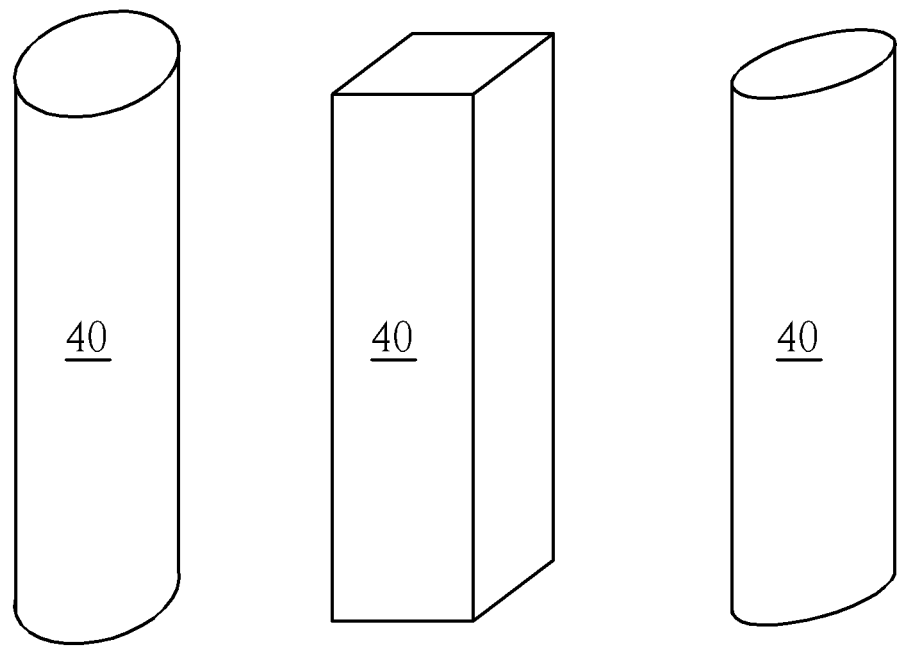
FIG. 7 illustrates some examples of the shapes of the pick up plugs.

Similarly, please refer to FIG. 2, a pick up plug 50 is obliquely disposed between the two pixel regions 31/32, or alternatively obliquely arranged to one of the four pixel regions, to gain a larger process window for the alignment steps. In other words, the pick up plug 50 is orthogonally arranged within the doping region 40 to gain a margin to tolerate more misalignment. For example, any edge 51 of the pick up plug 50 may be regarded as slantingly arranged to any edge 36 of the pixel regions 31/32/33/34. Preferably, the pick up plug 50 is not larger than the doping region 40. More preferably, the pick up plug 50 may be slightly smaller than the doping region 40 to be orthogonally disposed within the doping region 40. The pick up plug 50 may have different shapes, such as rectangular, round or oval, as shown in FIG. 7.

The pick up plug 50 is not intended to isolate each pixel regions. As shown in FIG. 4, the pick up plug 50 is used to dissipate the electron holes 12 in the pixel regions so the pick up plug 50 may include a conductive material, such as W, and is in direct contact with the doping region 40 and grounded to enable an upward conductive path 13 other than a downward conductive path 14 via the substrate 10.

In another embodiment of the present invention, to facilitate the pick up plug 50 to drain the electron holes in the pixel regions, the pick up plug 50 may be electrically connected to a metal routing 60 which is disposed on the pick up plug 50, and in an interlayer dielectric (ILD) layer 61 or in an intermetal dielectric (IMD) layer 62, as shown in FIG. 4. Because a metal is usually more electric conductive than a semiconductor material, such as doped Si, the upward conductive path 13 via the pick up plug 50 and the metal routing 60 is more efficient than the downward conductive path 14 via the substrate 10 to dissipate the electrons from the pixel regions. Despite channels are smaller, the present invention still provides a reliable structure and a method to quickly dissipate a lot of electron holes 12.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An image sensor, comprising:
   a substrate of a first dopant;
   a plurality of pixel regions separately disposed in said substrate;
   an isolation region for isolating each of said pixel regions, wherein said isolation region and said substrate have different dopant concentrations;
   at least one pickup region formed in said isolation region, and comprising a doping region and a pick up plug which is obliquely disposed with respect to said pixel regions and on said doping region and directly contacting said doping region, wherein said doping region is not in direct contact with said pixel regions, wherein said pick up plug is grounded to enable a conductive path other than said substrate.

2. The image sensor of claim 1, wherein said pick up plug is obliquely arranged within said doping region to gain a misalignment margin.

3. The image sensor of claim 1, further comprising:
   a neighboring pixel region of said second dopant disposed in said substrate and arranged adjacently to said pixel regions.

4. The image sensor of claim 3, wherein said doping region is not in direct contact with said neighboring pixel region.

5. The image sensor of claim 3, wherein said pick up plug is slantingly arranged to said neighboring pixel region.

6. The image sensor of claim 1, wherein said pick up plug is electrically connected to a metal routing disposed on said pick up plug.

7. The image sensor of claim 1, wherein said pick up plug comprises W.

8. A semiconductor structure, comprising:
   a substrate of a first dopant;
   a plurality of pixel regions separately disposed in said substrate to form a pixel unit;
   an isolation region for isolating each of said pixel regions, wherein said isolation region and said substrate have different dopant concentrations;
   at least one pickup region formed in said isolation region and comprising a doping region obliquely disposed with respect to said pixel regions and a pick up plug disposed on said doping region and directly contacting said doping region, wherein said pick up plug is grounded to enable a conductive path other than said substrate.

9. The semiconductor structure of claim 8, wherein said pick up plug is in orthogonal contact with said pixel regions.

10. The semiconductor structure of claim 8, wherein said pick up plug is obliquely arranged within said doping region to gain a misalignment margin.

11. The semiconductor structure of claim 8 for use in an image sensor cell.

12. The semiconductor structure of claim 8, wherein said pick up plug is rectangular.

13. The semiconductor structure of claim 8, wherein said pick up plug is obliquely arranged with respect to said pixel regions.

14. The semiconductor structure of claim 8, wherein said pick up plug is electrically connected to a metal routing disposed on said pick up plug.

15. The semiconductor structure of claim 8, wherein said pick up plug comprises W.

* * * * *